(12) United States Patent  (10) Patent No.: US 6,713,843 B2
Fu  (45) Date of Patent: Mar. 30, 2004

(54) SCRIBE LINES FOR INCREASING WAFER UTILIZABLE AREA

(75) Inventor: Chien-Chih Fu, Hsin-Chu (TW)

(73) Assignee: AMIC Technology Corporation, Hsin-Chu (TW)

( * ) Notice: Subject to any disclaimer, the term of this patent is extended or adjusted under 35 U.S.C. 154(b) by 0 days.

(21) Appl. No.: 10/063,887

(22) Filed: May 21, 2002

(65) Prior Publication Data

US 2003/0140514 A1 Jul. 31, 2003

(30) Foreign Application Priority Data

Jan. 28, 2002 (TW) ........................................ 91101405 A

(51) Int. Cl.⁷ ............................................ H01L 23/544
(52) U.S. Cl. ........................ 257/620; 257/797; 438/462
(58) Field of Search ................................. 257/620, 797; 438/462, 401

(56) References Cited

U.S. PATENT DOCUMENTS 6,075,280 A * 6/2000 Yung et al. .................. 257/620
6,329,700 B1 * 12/2001 Ishimura et al. ............ 257/620
6,528,864 B1 * 3/2003 Arai ........................... 257/620

* cited by examiner

Primary Examiner—Mark V. Prenty
(74) Attorney, Agent, or Firm—Winston Hsu

(57) ABSTRACT

Scribe lines for increasing a wafer utilizable area are provided. The scribe lines include at least a first scribe line arranged in a first direction in a first gap of a plurality of dies, and at least a second scribe line arranged in the first direction in a second gap of the dies. The first scribe line includes at least an alignment mark or a test key, therefore having a width greater than a width of the second scribe line that is provided for dicing a wafer into a plurality of individual dies. In addition, the scribe lines further include a plurality groups of scribe lines arranged in different directions, and each group of the scribe lines may have various scribe line widths.

26 Claims, 6 Drawing Sheets

SCRIBE LINES FOR INCREASING WAFER UTILIZABLE AREA

BACKGROUND OF INVENTION

1. Field of the Invention

The present invention relates to scribe lines on a wafer, and more particularly, to scribe lines for increasing wafer utilizable area and semiconductor chip yields.

2. Description of the Prior Art

With the development of integrated circuit technology, semiconductor chips have been made from wafers of semiconductor material whereby each chip contains a plurality of integrated circuits. After the wafer is completed, an individual chip is typically separated from other chips by dicing the wafer into small chips. Thereafter, the individual chips are mounted on carriers of various types, interconnected by wires and further packaged.

A scribe line is used to scribe and break the semiconductor wafer into individual dies. Please refer to FIG. 1 of a top view of scribe lines on a wafer according to the prior art. As shown in FIG. 1, the wafer includes a plurality of dies 10 arranged in a matrix, a plurality of vertical scribe lines X arranged in columns of the die matrix, and a plurality of horizontal scribe lines Y arranged in rows of the die matrix. In a typical semiconductor manufacturing process, the scribe lines X and Y are trenches, and the scribe lines X and Y are of an identical width $W_x$ and $W_y$, respectively. A range of the scribe line widths $W_x$ and $W_y$ is from tens to hundreds of micrometers, depending on the contents in the scribe lines.

Alignment marks or test keys are normally formed in the scribe lines X and Y for providing element alignment or defects monitoring at each manufacturing process step. When the alignment marks or test keys are formed in the scribe lines X and Y, the width $W_x$ and $W_y$ may reach approximately 150 micrometers. However, with the development of the complicated circuits on the chips, the scribe lines get broader. A scribe line width of hundreds of micrometers is thought to occupy a relatively large portion of the wafer, thus reducing the wafer utilizable area for producing the dies. In addition, problems such as uneven scribing or cracks are unavoidable for the broadened scribe lines to reduce production yields.

SUMMARY OF INVENTION

It is therefore an objective of the claimed invention to provide scribe lines for increasing a wafer utilizable area and improving semiconductor chip yields.

According to the claimed invention, the scribe lines include at least a first scribe line arranged in a first direction in a first gap of a plurality of dies, and at least a second scribe line arranged in the first direction in a second gap of the dies. The first scribe line includes at least an alignment mark or a test key, therefore having a width greater than a width of the second scribe line that is provided for dicing a wafer into a plurality of individual dies. In addition, the scribe lines further include a plurality groups of scribe lines arranged in different directions, and each group of the scribe lines may have various scribe line widths.

It is an advantage of the present invention that the width of each scribe line is determined according to the contents therein. For example, a greater width is required for the scribe line having a measurement device, such as an alignment mark or a test key. A narrower width is required for the scribe line having no measurement device. Therefore, the width of the scribe line without measurement device therein is reduce to half or even one-third of the width of the scribe line with measurement device therein. As a result, the wafer utilizable area is increased, and non-uniform problems of wafer dicing are prevented.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
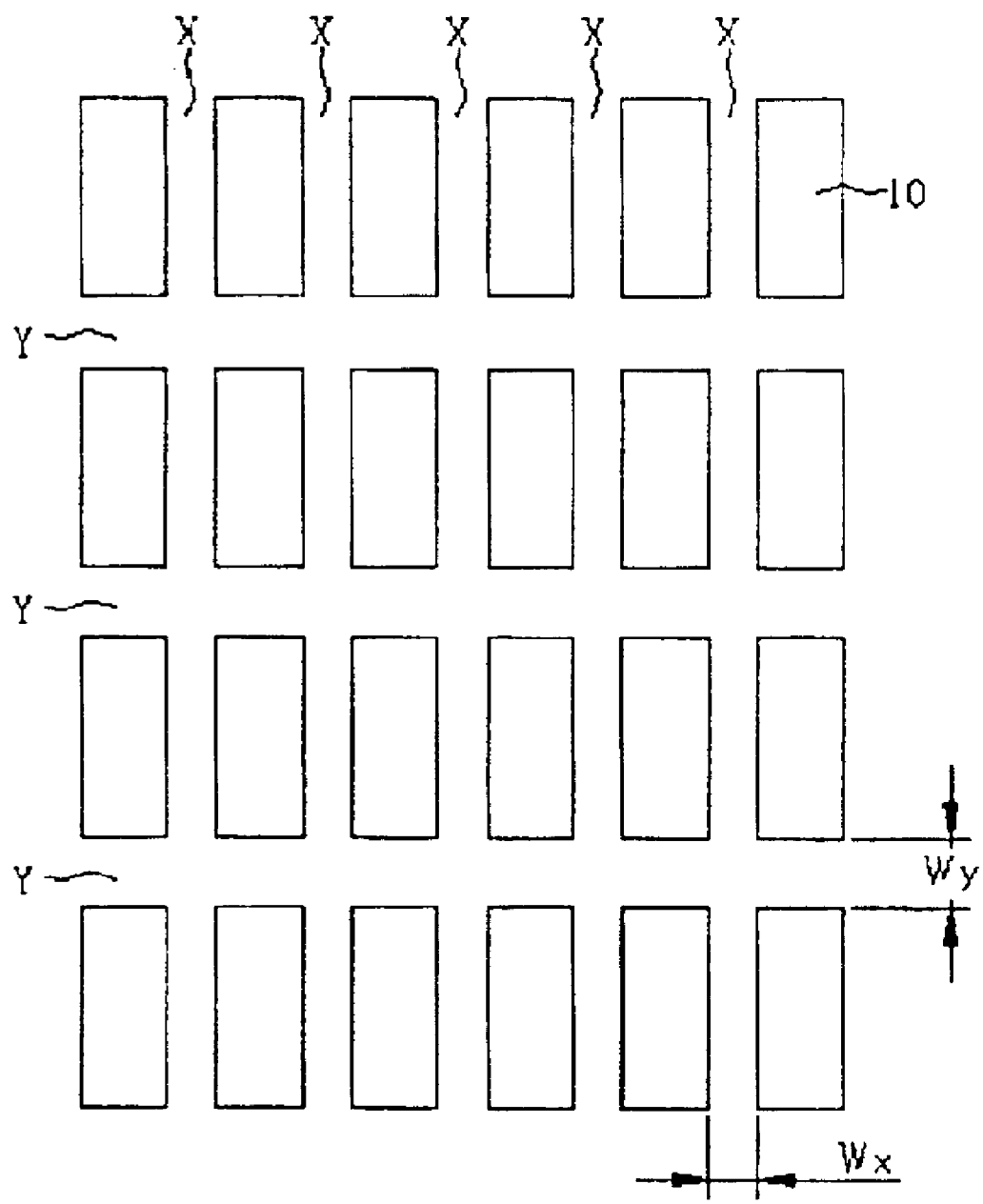
FIG. 1 is a top view of scribe lines on a wafer according to the prior art.
Figure 2:
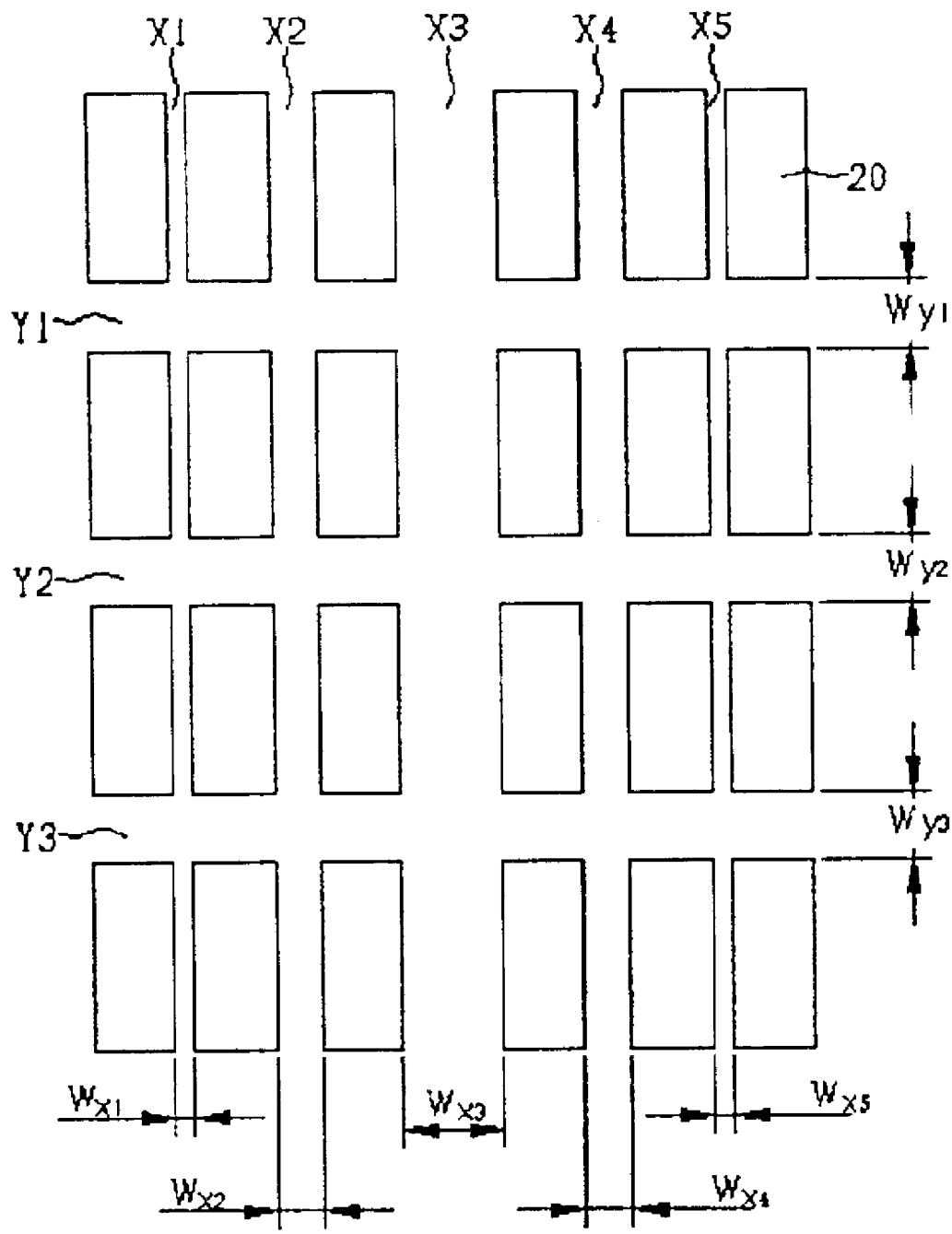
FIG. 2 is a top view of scribe lines on a wafer according to a first embodiment of the present invention.

Please refer to FIG. 2 of a top view of scribe lines on a wafer according to the present invention. The wafer includes a plurality of dies 20 arranged in a matrix, a plurality of vertical scribe lines X1, X2, X3, X4 and X5 arranged in columns of the die matrix, and a plurality of horizontal scribe lines Y1, Y2 and Y3 arranged in rows of the die matrix. The vertical scribe lines X1, X2, X3, X4 and X5 have a width of $W_{x1}$, $W_{x2}$, $W_{x3}$, $W_{x4}$ and $W_{x5}$, respectively. Depending on the device sizes in each scribe line, the widths $W_{x1}$, $W_{x2}$, $W_{x3}$, $W_{x4}$ and $W_{x5}$ can be either different or identical. For example, when the scribe lines X1 and X5 are identically provided for dicing the wafer and separating the dies, the widths $W_{x1}$ and $W_{x5}$ may have an identical value, ranging approximately between 10 and 50 micrometers. When measurement devices, such as alignment marks or test keys are formed in the scribe lines X2, X3 and X4, the widths $W_{x2}$, $W_{x3}$ and $W_{x4}$ may have an identical value greater than $W_{x1}$ and $W_{x5}$, ranging approximately between 100 and 500 micrometers. Alternatively, the widths $W_{x2}$, $W_{x3}$ and $W_{x4}$ may have a unique value depending on the measurement device sizes in each scribe line. Similarly to the vertical scribe lines, the widths $W_{y1}$, $W_{y2}$ and $W_{y3}$ of the horizontal scribe lines Y1, Y2 and Y3 may have different values or identical values depending on their contents.

A method for separating the dies includes etching, mechanical scribing, laser scribing, or a combination of etching, mechanical scribing and laser scribing. U.S. Pat. Nos. 6,075,280 and 6,214,703 have disclosed methods for separating dies on a wafer. However, in the present invention, the scribe lines have various widths to be difficult to use an identical stepping distance for dicing or testing. To solve the problems of uneven scribe line widths in a probe test, a multi-die probe card is provided to set a proper stepping distance for each step. When an identical stepping distance for each step is desired, a probe with programmable stepping indices for setting a proper initial point for each step should be used, as disclosed in U.S. Pat. No. 6,006,739.

Figure 3A:
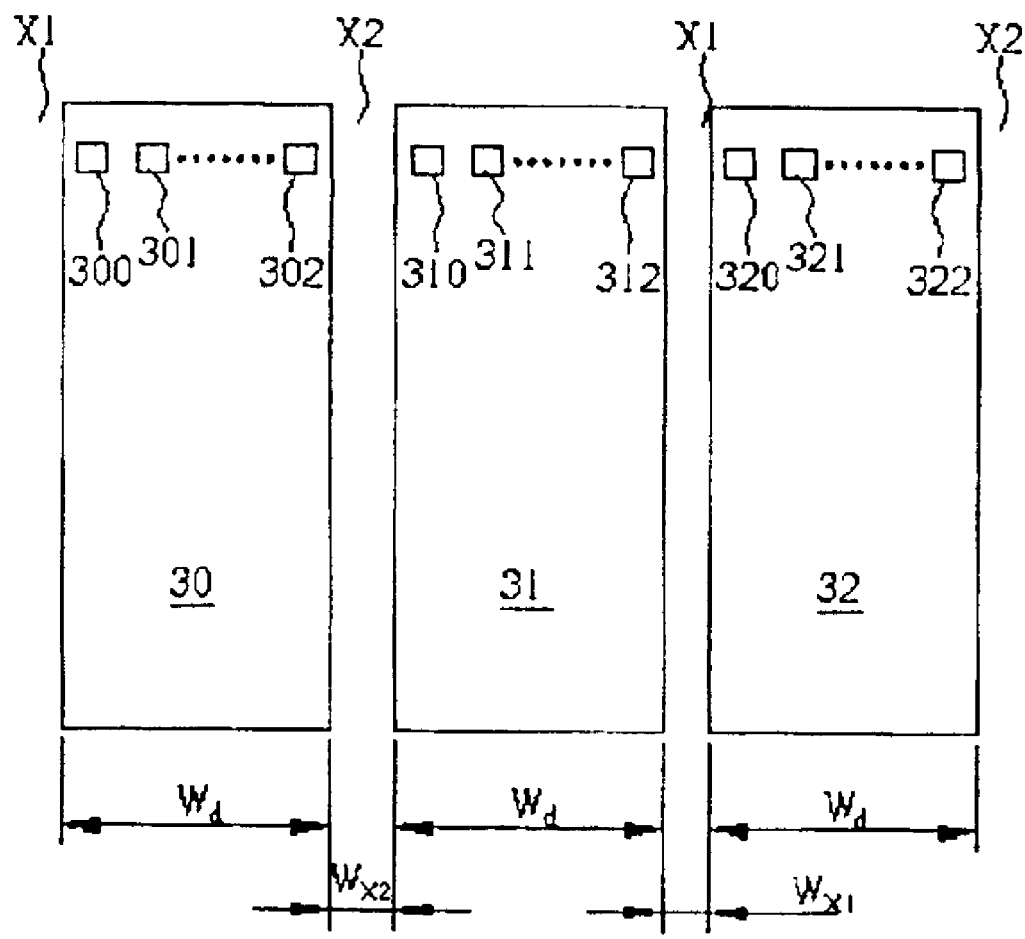
FIG. 3A and FIG. 3B are schematic diagrams of a method of providing a probe test across the various-sized scribe lines according to the present invention.
Figure 3B:
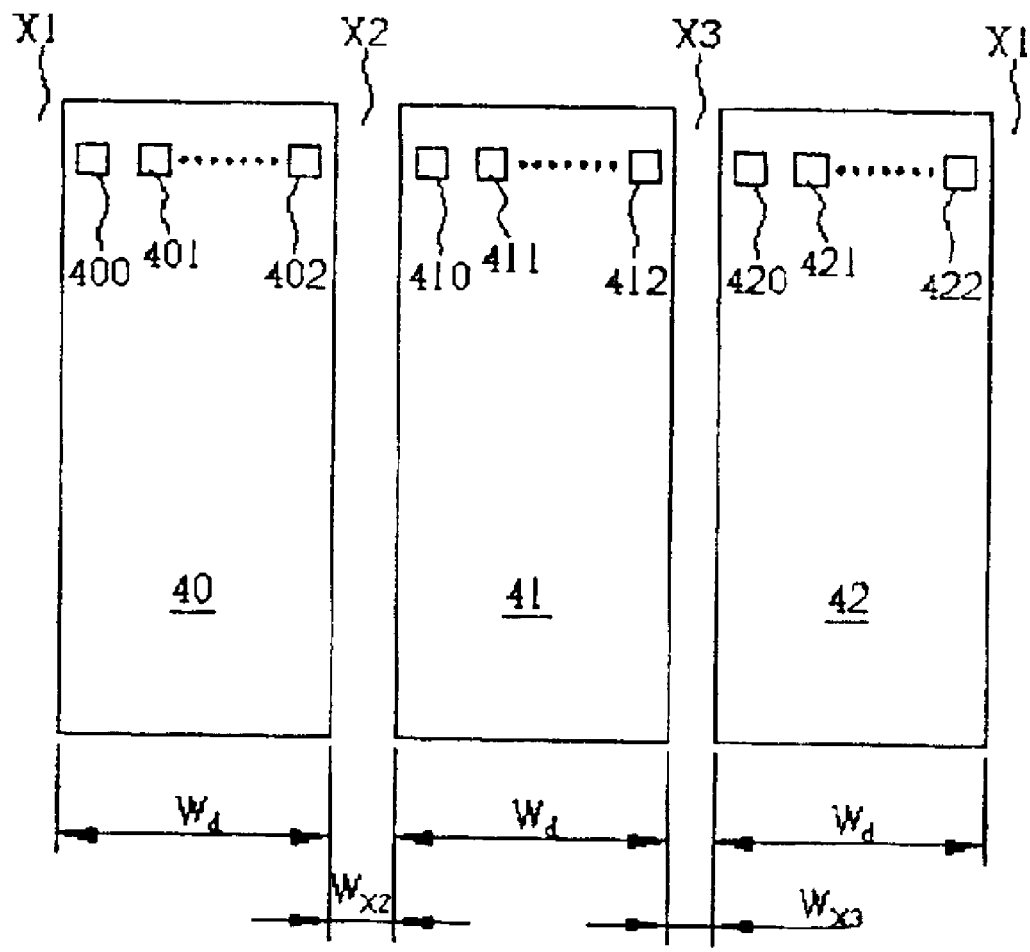

A method of providing a probe test on the dies according to the present invention is illustrated in FIG. 3A and FIG. 3B. FIG. 3A illustrates a probe test across the scribe lines with two widths, and FIG. 3B illustrates a probe test across the scribe lines with three widths. As shown in FIG. 3A, the wafer includes three dies 30, 31 and 32 in the same shape and size. A width of the dies 30, 31 and 32 is $W_d$. The die 30 includes a plurality of bonding pads, for example 300, 301 and 302 for contacting probe pins. The die 31 includes a plurality of bonding pads 310, 311 and 312. The die 32 includes a plurality of bonding pads 320, 321 and 322. Scribe lines X1 and X2 are respectively positioned in a gap between the die 30 and an object at the left side of the die 30, in a gap between the dies 30 and 31, in a gap between the dies 31 and 32, and in a gap between the die 32 and an object at the right side of the die 32, etc. The scribe lines X1 and X2 have a width of $W_{x1}$ and $W_{x2}$, respectively. In the step and repeat probe test, a probe card is provided to test each bonding pad on a die. Following this, the probe card is moved to an adjacent die to continue testing the bonding pads thereon. Assume that an initial point for testing the die 30 is set on the bonding pad 300, an initial point for testing the die 31 should be moved to the bonding pad 310, and an initial point for testing the die 32 should be moved to the bonding pad 320. Since the widths of the scribe lines X1 and X2 are different, the probe card needs to move a stepping distance of $W_d+W_{x1}$ from the bonding pad 310 to the bonding pad 320, and a stepping distance of $W_d+W_{x2}$ from the bonding pad 300 to the bonding pad 310. In order to get an identical stepping distance for the probe card, the coordinates of the bonding pads should be adjusted. For example, when an identical stepping distance for the probe card equals to $W_d+(W_{x1}+W_{x2})/2$, the x-coordinates of the bonding pads on the dies 30 and 32 should add $(W_{x2}-W_{x1})/2$, and the x-coordinates of the bonding pads on the die 31 should add $(W_{x1}-W_{x2})/2$.

As shown in FIG. 3B, the wafer includes three dies 40, 41 and 42 in the same shape and size. A width of the dies 40, 41 and 42 is $W_d$. The die 40 includes a plurality of bonding pads, for example 400, 401 and 402 for contacting probe pins. The die 41 includes a plurality of bonding pads 410, 411 and 412. The die 42 includes a plurality of bonding pads 420, 421 and 422. Scribe lines X1, X2 and X3 are respectively positioned in a gap between the die 40 and an object at the left side of the die 40, in a gap between the dies 40 and 41, in a gap between the dies 41 and 42, and in a gap between the die 42 and an object at the right side of the die 42, etc. The scribe lines X1, X2 and X3 have a width of $W_{x1}$, $W_{x2}$ and $W_{x3}$, respectively. In the step and repeat probe test, a probe card is provided to test each bonding pad on a die. Following this, the probe card is moved to an adjacent die to continue testing the bonding pads thereon. Assume that an initial point for testing the die 40 is set on the bonding pad 400, an initial point for testing the die 41 should be moved to the bonding pad 410, and an initial point for testing the die 42 should be moved to the bonding pad 420. Since the widths of the scribe lines X1, X2 and X3 are different, the probe card needs to move a stepping distance of $W_d+W_{x1}$ from the first bonding pad on the left die of the die 40 to the bonding pad 400, a stepping distance of $W_d+W_{x2}$ from the bonding pad 400 to the bonding pad 410, and a stepping distance of $W_d+W_{x3}$ from the bonding pad 410 to the bonding pad 420. In order to get an identical stepping distance for the probe card, the coordinates of the bonding pads should be adjusted. For example, when an identical stepping distance for the probe card equals to $W_d+(W_{x1}+W_{x2}+W_{x3})/3$, the x-coordinates of the bonding pads on the die 40 should add $(2W_{x2}-W_{x1}-W_{x3})/3$, the x-coordinates of the bonding pads on the die 42 should add $(W_{x1}+W_{x2}-2W_{x3})/3$, and the x-coordinates of the bonding pads on the die 41 remains the same.

Figure 4:
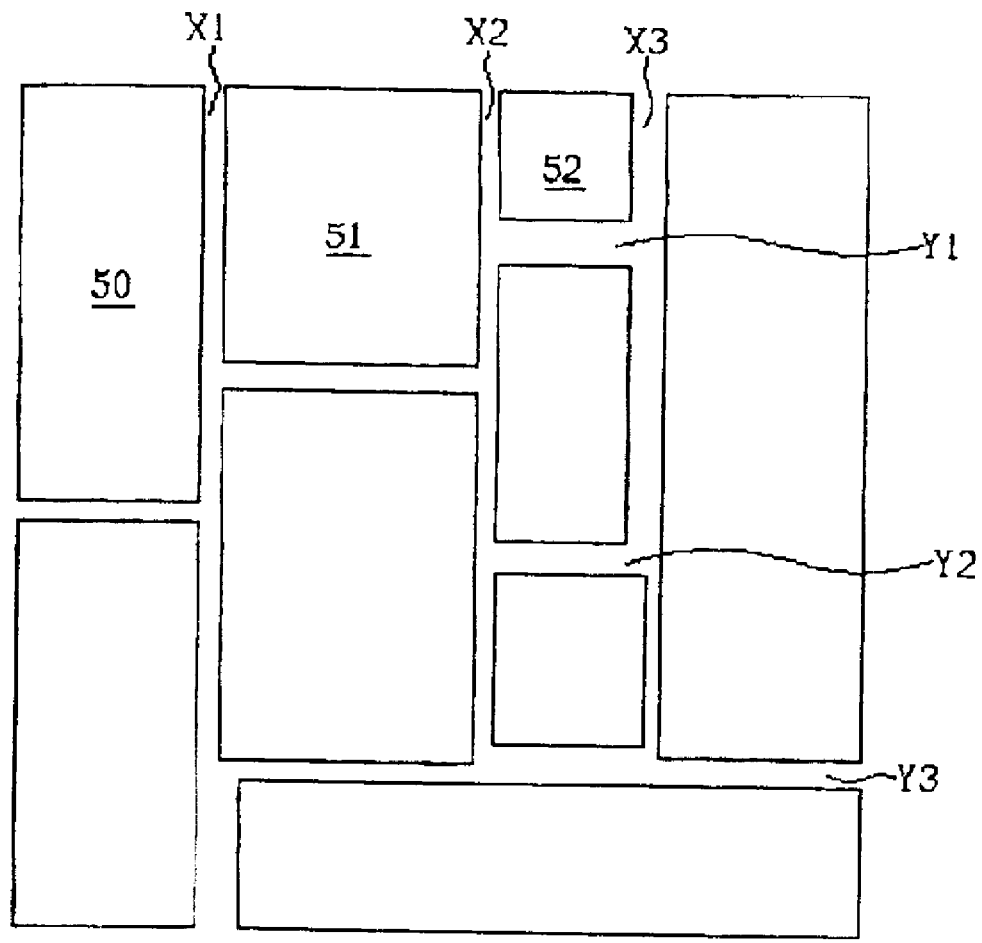
FIG. 4 is a top view of scribe lines on a wafer according to a second embodiment of the present invention.

The dies shown in FIG. 2 are all of the same shape and size, however, the scribe lines with various widths can be applied in a wafer having dies in various shapes or sizes according to the present invention. Please refer to FIG. 4 of a top view of scribe lines on a wafer according to a second embodiment of the present invention. The wafer includes a plurality of dies in an identical shape and different sizes. As shown in FIG. 4, the wafer includes a plurality of rectangular dies, such as dies 50, 51 and 52. The sizes of the dies 50, 51 and 52 are different. A plurality of vertical scribe lines X1, X2 and x3 are positioned in vertical gaps of the dies. A plurality of horizontal scribe lines Y1, Y2 and Y3 are positioned in horizontal gaps of the dies. The scribe lines arranged in the same direction have various widths. Alternatively, the scribe lines having identical contents may get an identical width.

Figure 5:
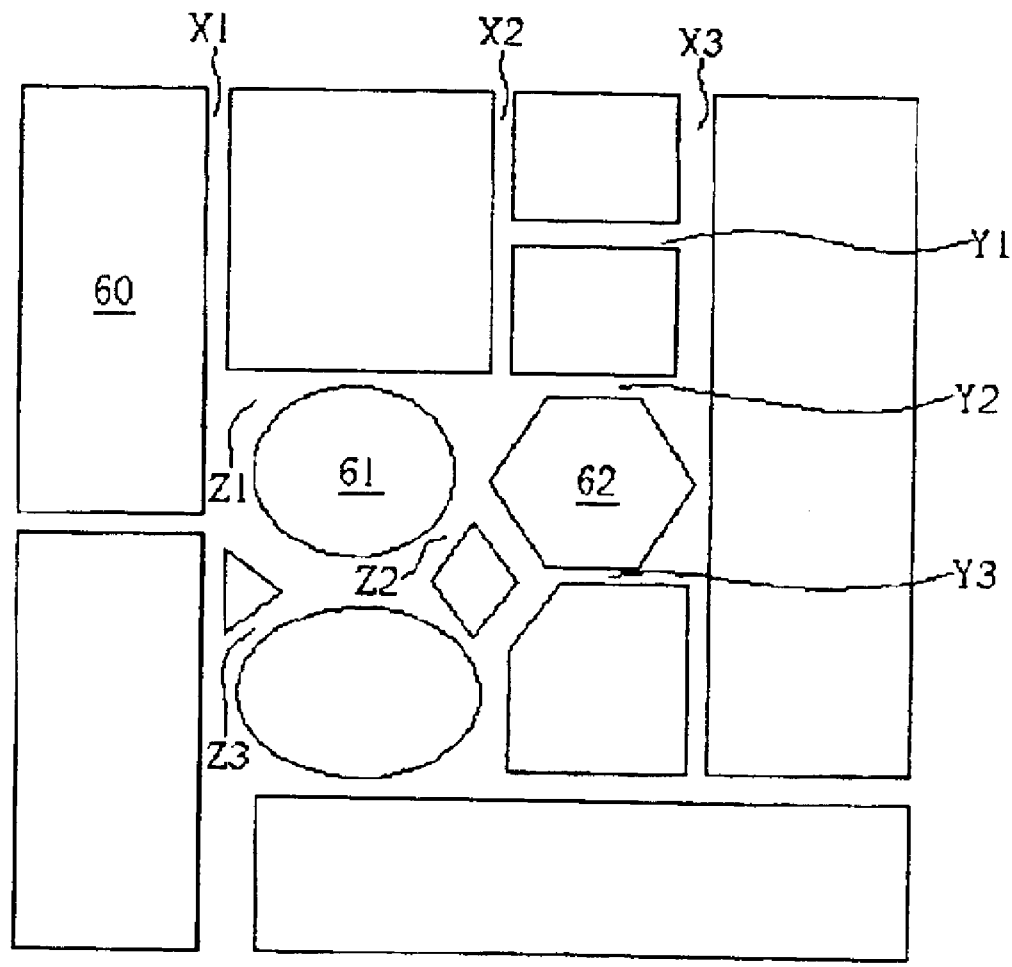
FIG. 5 is a top view of scribe lines on a wafer according to a third embodiment of the present invention.

Please refer to FIG. 5 of a top view of scribe lines on a wafer according to a third embodiment of the present invention. The wafer includes a plurality of dies in different shapes and sizes. As shown in FIG. 5, the wafer includes a plurality of dies in different shapes and sizes, such as a rectangular die 60, a circular die 61 and a hexagonal die 62. A plurality of scribe lines arranged in different directions are positioned in the gaps of the dies. For example, the scribe lines X1, X2 and X3 are arranged in a vertical direction, the scribe lines Y1, Y2 and Y3 are arranged in a horizontal direction, and the scribe lines Z1, Z2 and Z3 are arranged in a diagonal direction. The scribe lines arranged in the same direction have various widths. Alternatively, the scribe lines having the same contents may get an identical width.

It is an advantage of the present invention that the width of each scribe line is determined according to the contents in the scribe line, therefore increasing wafer utilizable area and preventing non-uniform problems of wafer dicing.

In contrast to the scribe lines of the prior art, the scribe lines of the present invention have various widths. The scribe line width depends on whether a measurement device is formed in the scribe line or not. For example, a greater width is required for the scribe line having a measurement device, such as an alignment mark or a test key. A narrower width is required for the scribe line having no measurement device. Therefore, the width of the scribe line without measurement device therein is reduce to half or even one-third of the width of the scribe line with measurement device therein. As a result, the wafer utilizable area is increased, non-uniform problems of wafer dicing are prevented, and the production yields are effectively improved.

Those skilled in the art will readily observe that numerous modifications and alterations of the device may be made while retaining the teachings of the invention.

Accordingly, the above disclosure should be construed as limited only by the metes and bounds of the appended claims.

What is claimed is:

1. Scribe lines for increasing a utilizable area on a wafer, the wafer comprising a plurality of dies in various shapes, the scribe lines comprising:

at least a first scribe line arranged in a first direction in a first gap of the dies, the first scribe line having a first width; and at least a second scribe line arranged in the first direction in a second gap of the dies, the second scribe line having a second width narrower than the first width.

2. The scribe lines of claim 1 wherein the first scribe line comprises at least an alignment mark for aligning elements on different dies.

3. The scribe lines of claim 1 wherein the first scribe line comprises at least a test key for performing a quality test on the dies.

4. The scribe lines of claim 1 wherein the first width is approximately between 100 and 500 micrometers.

5. The scribe lines of claim 1 wherein the second width is approximately between 10 and 50 micrometers.

6. The scriee lines of claim 1 wherein the second scribe line is provided for dicing the wafer.

7. The scribe lines of claim 1 wherein the wafer is scribed by supplying a mechanical stress on the scribe lines.

8. The scribe lines of claim 1 wherein the wafer is scribed by performing an etching process on the scribe lines.

9. The scribe lines of claim 1 further comprising a plurality of scribe lines arranged in a second direction, the scribe lines arranged in the second direction comprising various scribe line widths.

10. The scribe lines of claim 9 wherein the second direction is perpendicular to the first direction.

11. The scribe lines of claim 1 wherein the dies comprise various die sizes.

12. Scribe lines on a wafer, the wafer comprising a plurality of dies in various sizes, the scribe lines comprising:
  a plurality of first scribe lines positioned in gaps of the dies, each of the first scribe lines comprising a predetermined pattern; and
  a plurality of second scribe lines positioned in gaps of the dies, the second scribe lines being narrower than the first scribe lines.

13. The scribe lines of claim 12 wherein the predetermined pattern comprises an alignment mark for aligning elements on different dies.

14. The scribe lines of claim 12 wherein the predetermined pattern comprises a test key for performing a quality test on the dies.

15. The scribe lines of claim 12 wherein the first scribe lines comprise at least an arranging direction.

16. The scribe lines of claim 12 wherein the second scribe lines comprise at least an arranging direction.

17. The scribe lines of claim 12 wherein the dies comprise various die shapes.

18. Scribe lines on a wafer, the wafer comprising a plurality of dies, the scribe lines comprising:
  a plurality of first scribe lines arranged in a first direction in gaps of the dies, the first scribe lines being divided into at least a first group and a second group, each of the first scribe lines of the first group comprising a first pattern and a first width, and each of the first scribe lines of the second group comprising a second pattern and a second width; and
  a plurality of second scribe lines arranged in the first direction in gaps of the dies, the second scribe lines being narrower than the first scribe lines;
  wherein the values of the first width and the second width depend on the first pattern size and the second pattern size, respectively.

19. The scribe lines of claim 18 wherein the first pattern comprises at least an alignment mark for aligning elements on different dies.

20. The scribe lines of claim 18 wherein the first pattern comprises at least a test key for performing a quality test on the dies.

21. The scribe lines of claim 18 wherein the second pattern comprises at least an alignment mark for aligning elements on different dies.

22. The scribe lines of claim 18 wherein the second pattern comprises at least a test key for performing a quality test on the dies.

23. The scribe lines of claim 18 wherein the second scribe lines are provided for dicing the wafer.

24. The scribe lines of claim 18 wherein the dies are in the same shapes and sizes.

25. The scribe lines of claim 18 wherein the dies comprise various die shapes.

26. The scribe lines of claim 18 wherein the dies comprise various die sizes.

* * * * *